United States Patent
Nakamura et al.

(10) Patent No.: US 9,295,155 B2
(45) Date of Patent: Mar. 22, 2016

(54) FLEXIBLE PRINTED BOARD

(75) Inventors: Naoki Nakamura, Kawasaki (JP); Shigeru Sugino, Kawasaki (JP); Nobuo Taketomi, Kawasaki (JP); Ryo Kanai, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 357 days.

(21) Appl. No.: 13/590,908

(22) Filed: Aug. 21, 2012

(65) Prior Publication Data

US 2012/0312586 A1 Dec. 13, 2012

Related U.S. Application Data

(62) Division of application No. 12/698,635, filed on Feb. 2, 2010, now Pat. No. 8,269,114.

(30) Foreign Application Priority Data

Feb. 26, 2009 (JP) .................... 2009-43738

(51) Int. Cl.
*H05K 1/00* (2006.01)
*H05K 1/11* (2006.01)
*H05K 1/02* (2006.01)

(52) U.S. Cl.
CPC .............. *H05K 1/118* (2013.01); *H05K 1/0281* (2013.01); *H05K 1/117* (2013.01); *H05K 2201/09709* (2013.01); *H05K 2201/09727* (2013.01);
(Continued)

(58) Field of Classification Search
CPC ... H05K 1/0392; H05K 1/0393; H05K 1/117; H05K 1/118; H05K 2201/09709; H05K 2201/09727; H05K 2201/09781; H05K 2201/2009

USPC .......................... 174/254; 361/748–751, 774
See application file for complete search history.

(56) References Cited

U.S. PATENT DOCUMENTS

2006/0215377 A1* 9/2006 Nomura et al. ............... 361/748

FOREIGN PATENT DOCUMENTS

| CN | 2927606 Y | 7/2007 |
| JP | 51-153446 U | 12/1976 |

(Continued)

OTHER PUBLICATIONS

Taiwanese Office Action dated Oct. 31, 2012, issued in corresponding Taiwanese patent application No. 099103320, w/ English translation.

(Continued)

*Primary Examiner* — Chau N Nguyen
*Assistant Examiner* — Paul McGee, III
(74) *Attorney, Agent, or Firm* — Westerman, Hattori, Daniels & Adrian, LLP

(57) ABSTRACT

A flexible printed board includes a base material, first conductive pads arranged along an imaginary line on the base material and extending with a first width from front end to rear end on a front side of the imaginary line, second conductive pads arranged along the imaginary line and extending with a second width from front end on a rear side of the imaginary line to rear end, first wiring patterns provided between the second conductive pads, and extending with a third width to front end connected to the rear ends of the first conductive pads, and a reinforcing layer for reinforcing a reinforcing area over the first conductive pads and the first wiring patterns, and having a front edge on a front side of rear ends of the first conductive pads and a rear edge on a rear side of the rear ends of the second conductive pads.

2 Claims, 18 Drawing Sheets

(52) U.S. Cl.
CPC ............... *H05K2201/09781* (2013.01); *H05K 2201/2009* (2013.01)

(56) References Cited

FOREIGN PATENT DOCUMENTS

| JP | 6-085420 A | 3/1994 |
| JP | 08-046310 A | 2/1996 |
| JP | 08046310 A * | 2/1996 |
| JP | 9-092949 A | 4/1997 |
| JP | 10-117049 A | 5/1998 |
| JP | 2002-151806 A | 5/2002 |
| JP | 2003-249592 A | 9/2003 |
| JP | 2006-237158 A | 9/2006 |
| JP | 2006237158 A * | 9/2006 |
| JP | 2008-28239 A | 2/2008 |
| JP | 2008-235717 A | 10/2008 |
| TW | 2007-11544 A | 3/2007 |

OTHER PUBLICATIONS

Japanese Office Action dated Dec. 25, 2012, issued in corresponding Japanese patent application No. 2009-043738, w/ partial English translation.

Chinese Office Action dated May 25, 2011, issued in corresponding Chinese Patent Application No. 201010125290.4.

Korean Office Action dated May 11, 2011, issued in corresponding Korean Patent Application No. 10-2010-0015258.

* cited by examiner

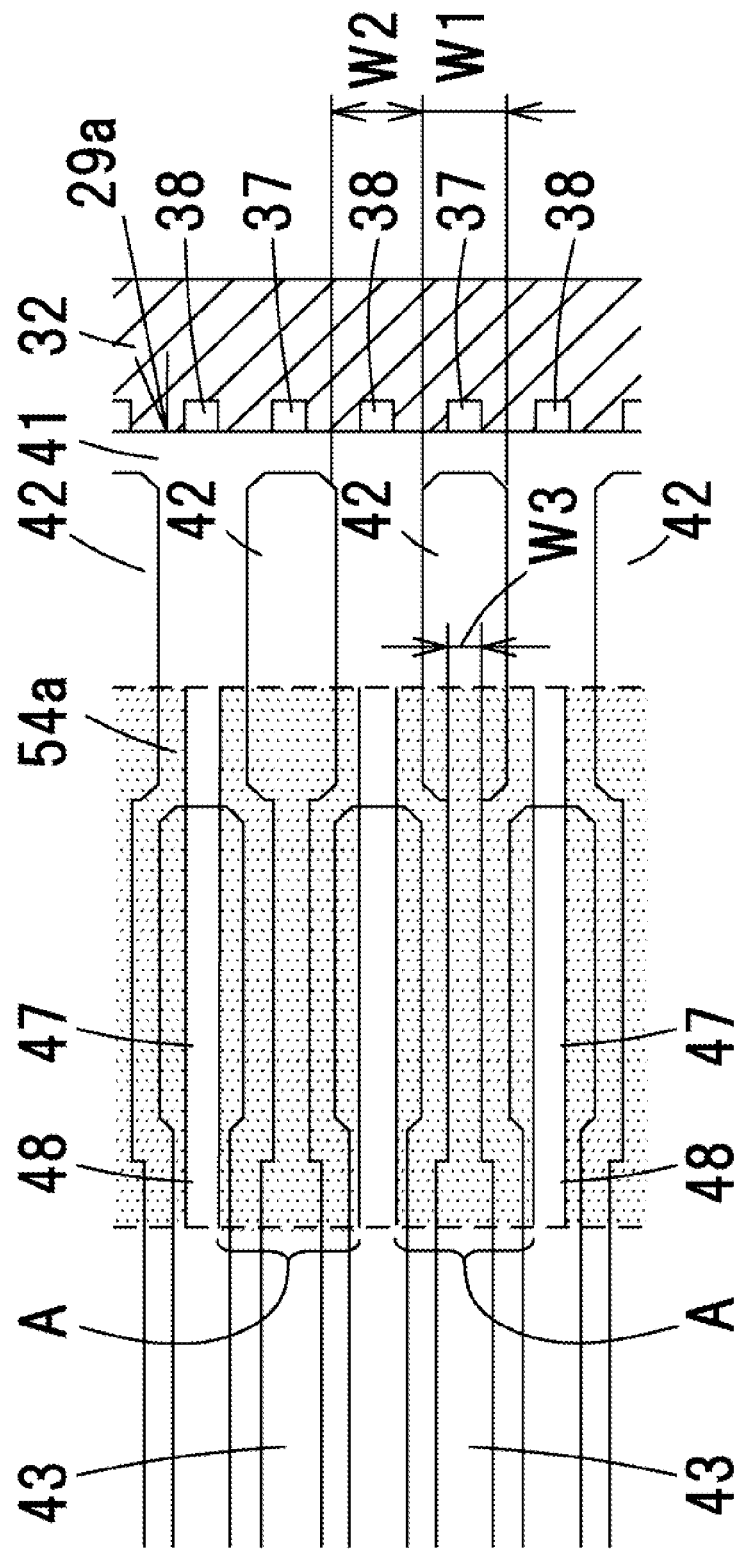

FLEXIBLE PRINTED BOARD

CROSS-REFERENCE TO RELATED APPLICATIONS

This application is a divisional of U.S. application Ser. No. 12/698,635, filed Feb. 2, 2010, which is pending, and both are based upon and claim the benefit of priority of the prior Japanese Patent Application No. 2009-43738, filed on Feb. 26, 2009, the entire contents of which are incorporated herein by reference.

FIELD

The embodiments discussed herein are related to a flexible printed board including a base material, conductive pads provided on a surface of the base material, and wiring patterns connected to the conductive pads.

BACKGROUND

In a housing of a mobile telephone terminal, for example, a dome-switch sheet is placed on a back surface of a keypad. The dome-switch sheet is formed by, for example, a flat flexible printed board, and is connected to a printed board incorporated in the mobile telephone terminal. Electronic components mounted on the printed board are connected. The dome-switch sheet is connected to the printed board by a flexible printed board. A base end of the flexible printed board extends in the dome switch sheet, and a leading end of the flexible printed board is fitted in a connector provided on the printed board. The keypad is connected to the electronic components on the printed board.

The connector has a housing. A receptacle is provided in the front of the housing and extends in the width direction of the housing. Conductive terminals are provided in the receptacle in a manner such as to point upward. The housing is connected to a lock plate that extends in the width direction of the housing and pivots on a pivot shaft. When the leading end of the flexible printed board is inserted in the receptacle, conductive pads of the flexible printed board are elastically received by the conductive terminals. The lock plate pivots to be pressed against the surface of the flexible printed board. Thus, the flexible printed board is clamped between the lock plate and the conductive terminals.

With reduction in size and thickness of the mobile telephone terminal, the space of the flexible printed board is limited. Even when the number of conductive pads increases, the space does not increase. Because of the limited space, for example, the conductive terminals are arranged in two lines in the width direction of the flexible printed board. Wiring patterns to be connected to the front line of conductive terminals are provided between the rear line of conductive terminals. As a result, the width of the wiring patterns is reduced markedly. When the flexible printed board is inserted, a pressing force acts on the flexible printed board from a rear end of the lock plate because of pivotal motion of the lock plate. When a great stress is generated at the boundary between the wiring pattern and the conductive pad, the wiring pattern is broken by cracking. Further, when the stress is great, the conductive pad is also broken.

SUMMARY

According to an aspect of the invention, a flexible printed board includes a base material, first conductive pads arranged along an imaginary line on the base material and extending with a first width from front end of the first conductive pads to rear ends of the first conductive pads on a front side of the imaginary line, second conductive pads arranged along the imaginary line and extending with a second width from front end of the second conductive pads on a rear side of the imaginary line to rear ends of the second conductive pads, first wiring patterns provided between the second conductive pads, and extending with a third width to front end connected to the rear ends of the first conductive pads, and a reinforcing layer for reinforcing a reinforcing area over the first conductive pads and the first wiring patterns, and having a front edge on a front side of rear ends of the first conductive pads and a rear edge on a rear side of the rear ends of the second conductive pads The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 18 illustrates a plan view schematically illustrating a structure of a flexible printed board according to a modification of the second embodiment.

DESCRIPTION OF EMBODIMENTS

An embodiment of the present invention will be described below with reference to the attached drawings.

Figure 1:
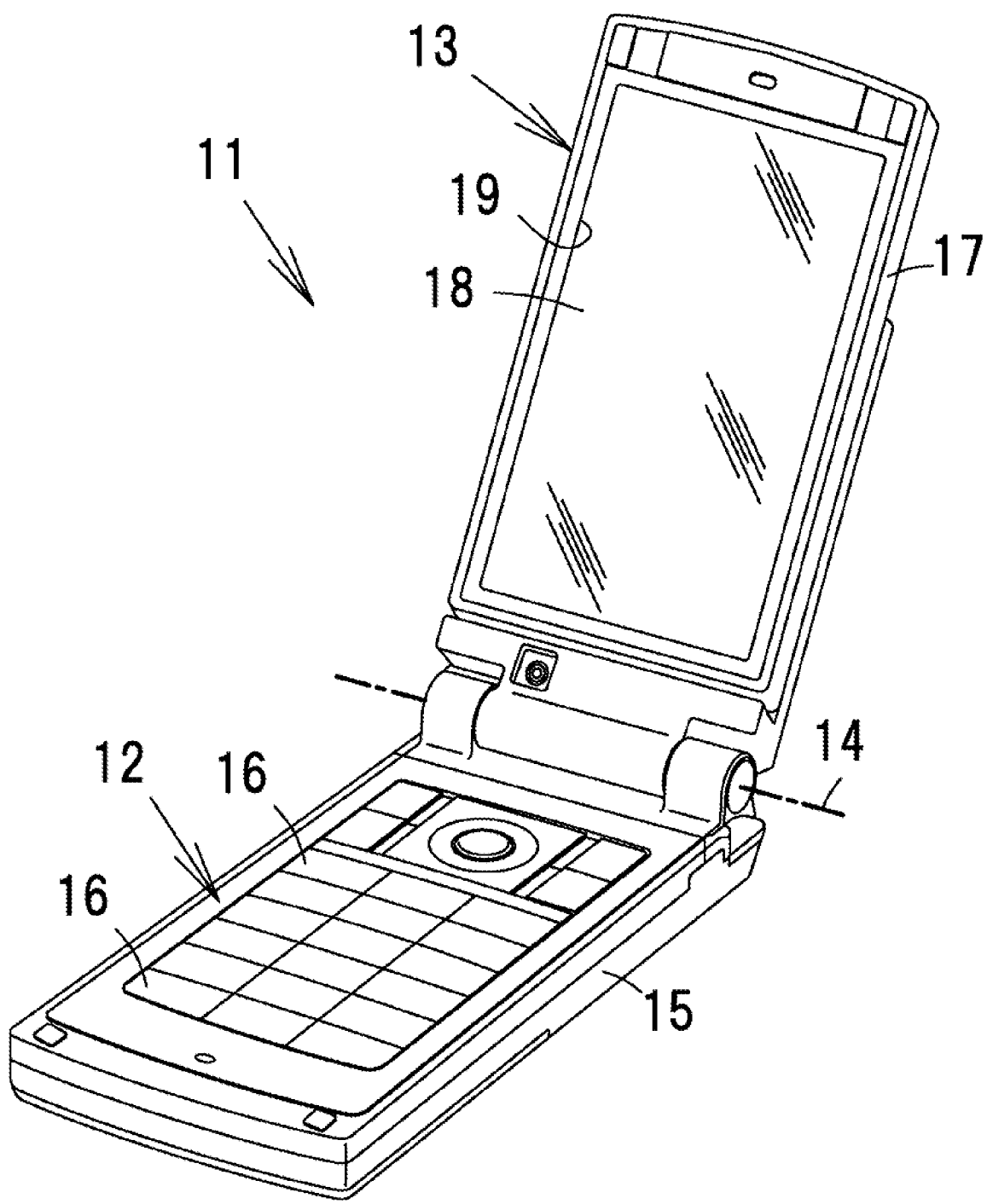
FIG. 1 illustrates a perspective view schematically illustrating a configuration of a mobile telephone terminal as an example of an electronic apparatus.

FIG. 1 schematically illustrates an outward appearance of a mobile telephone terminal 11 as a specific example of an electronic apparatus according to the present invention. The mobile telephone terminal 11 includes a key operation unit 12 and an image display unit 13. One end of the key operation unit 12 and one end of the image display unit 13 are connected by an arbitrary horizontal shaft 14. The image display unit 13 pivots on the horizontal shaft 14 relative to the key operation unit 12.

The key operation unit 12 has a body casing 15 incorporating a substrate module that will be described below. The substrate module incorporates, for example, processing circuits such as a calculation circuit and a memory. The body casing 15 is provided with a flat surface extending parallel to the horizontal shaft 14. In the flat surface, control buttons 16, such as an on-hook button, an off-hook button, and a dial key, are embedded. In accordance with operations of the control buttons 16, the processing circuits perform various operations.

The image display unit 13 has a display casing 17. The display casing 17 is provided with a flat surface extending parallel to the horizontal shaft 14. In the flat surface, a planar display panel unit, such as a liquid crystal display (LCD) panel unit 18, is incorporated. The flat surface has a display aperture 19, and a screen of the LCD panel unit 18 faces the display aperture 19. The screen of the LCD panel unit 18 displays various texts and graphics in accordance with operations of the processing circuits.

The positional relationship between the flat surface of the image display unit 13 and the horizontal shaft 14 reflects the positional relationship between the flat surface of the key operation unit 12 and the horizontal shaft 14. As a result, when the image display unit 13 pivots on the horizontal shaft 14 relative to the key operation unit 12, the flat surface of the image display unit 13 and the flat surface of the key operation unit 12 are placed one on the other, whereby the mobile telephone terminal 11 is folded and the control buttons 16 and the LCD panel unit 18 are protected.

Figure 2:
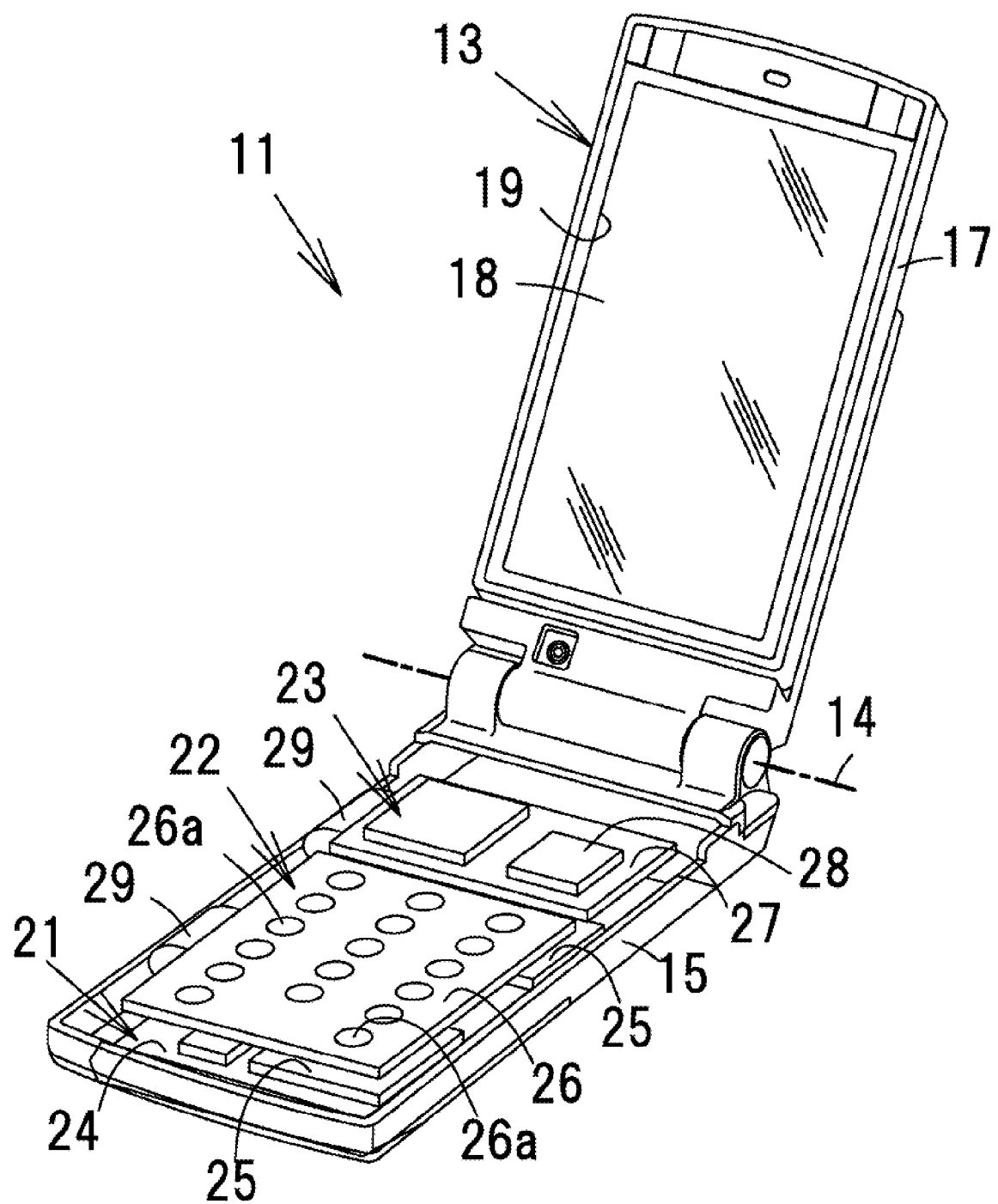
FIG. 2 illustrates a perspective view schematically illustrating the configuration of the mobile telephone terminal.

As illustrated in FIG. 2, a main substrate module 21 is housed in an accommodating space of the body casing 15. On the main substrate module 21, a pair of sub-substrate modules 22 and 23 are arranged in parallel. The main substrate module 21 includes a printed board 24 formed of, for example, resin. Electronic components 25, including processing circuits such as a calculation circuit and a memory, are mounted on a surface of the printed board 24.

The sub-substrate module 22 includes a flat flexible printed board 26. The flat flexible printed board 26 has a rigid printed board and a flexible printed board. On a surface of the flat flexible printed board 26, dome switches 26a are provided corresponding to the control buttons 16. When a depressing force is applied to any of the control buttons 16, the corresponding dome switch 26a is closed. On the other hand, the sub-substrate module 23 includes a flat flexible printed board 27 on which electronic components 28 are mounted.

Figure 3:
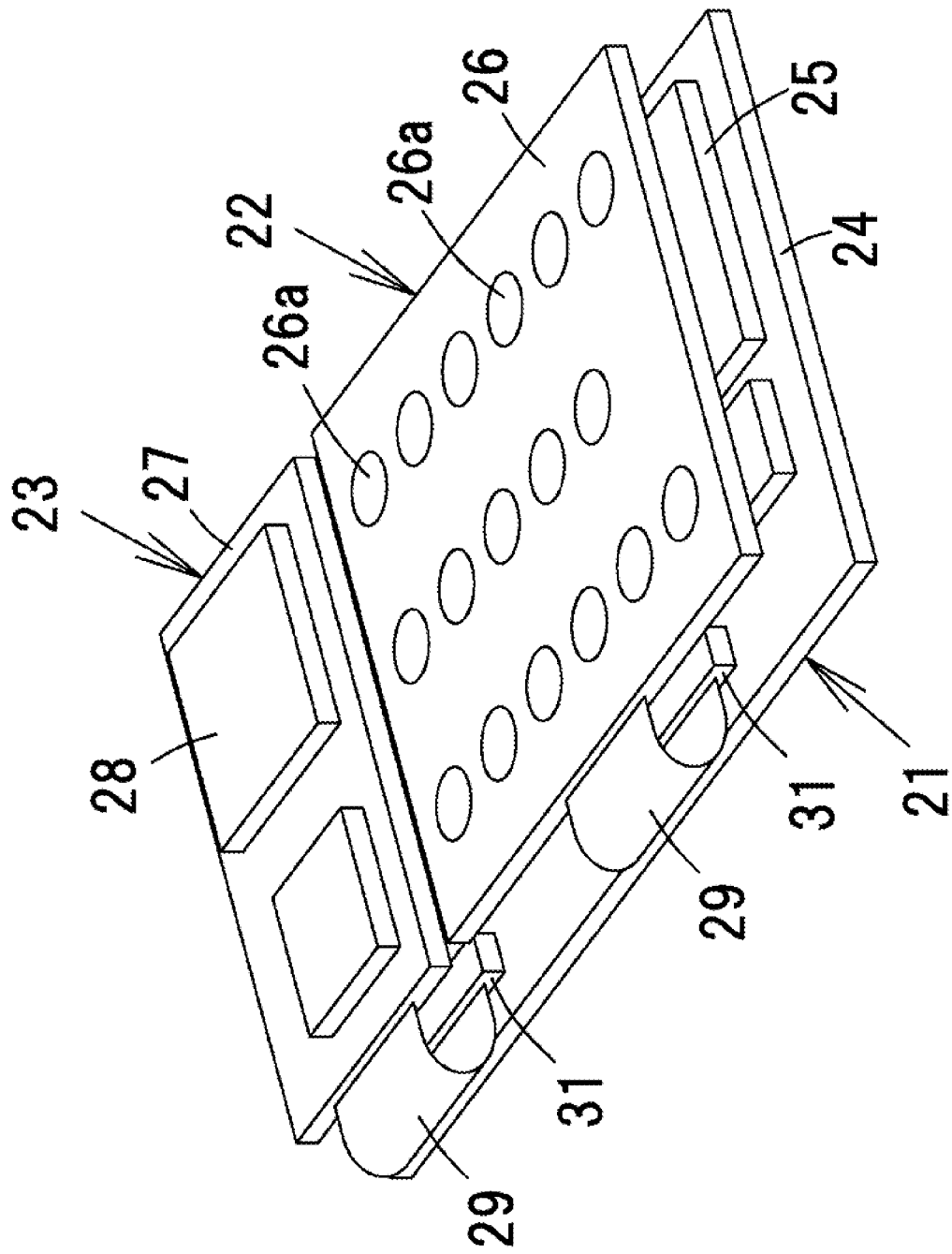
FIG. 3 illustrates a perspective view schematically illustrating a structure of a printed board module.

As illustrated in FIG. 3, the flat flexible printed boards 26 and 27 respectively include flexible printed boards 29. The sub-substrate modules 22 and 23 are connected to the main substrate module 21 by the flexible printed board 29. Base ends of the flexible printed boards 29 extend in the flat flexible printed boards 26 and 27, for example, in a manner such as to have the same outlines as those of the flat flexible printed boards 26 and 27. Leading ends of the flexible printed boards 29 are connected to connectors 31 mounted on the surface of the printed board 24.

Figure 4:
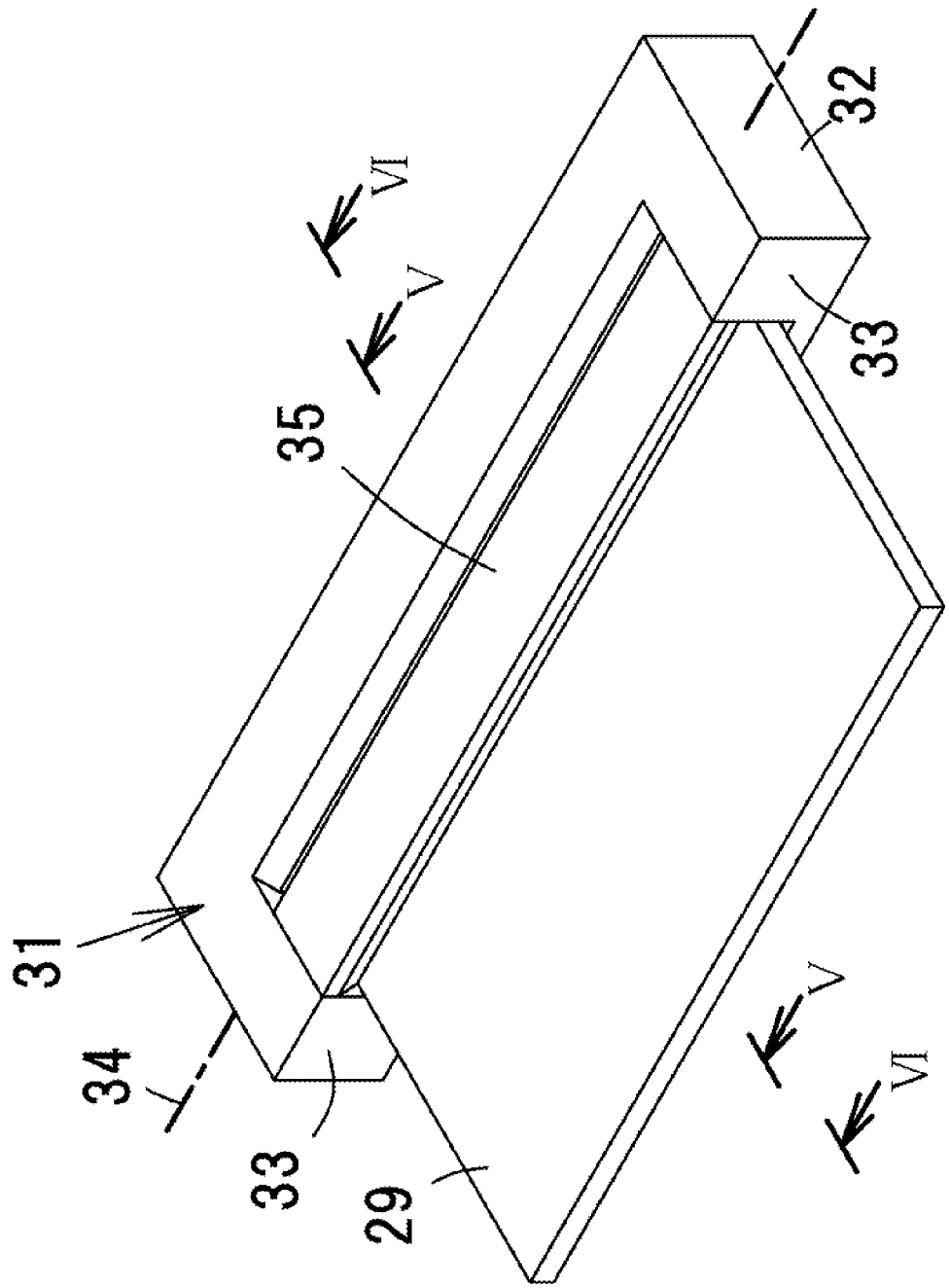
FIG. 4 illustrates a perspective view schematically illustrating a structure of a connector.

As illustrated in FIG. 4, each connector 31 has a resin housing 32, for example, shaped like a rectangular parallelepiped. Guides 33 are provided at either longitudinal end of the housing 32. The flexible printed board 29 is placed between the guides 33, and the guides 33 receive side edges of the flexible printed board 29 by inner ends thereof. Thus, the guides 33 position the flexible printed board 29 in the lateral direction. A lock plate 35, for example, formed of resin is connected to the guides 33 in a manner such as to pivot on a pivot shaft 34. At a lock position, the lock plate 35 is received by a back surface of the flexible printed board 29. The pivot shaft 34 extends in the longitudinal direction of the housing 32.

Figure 5:
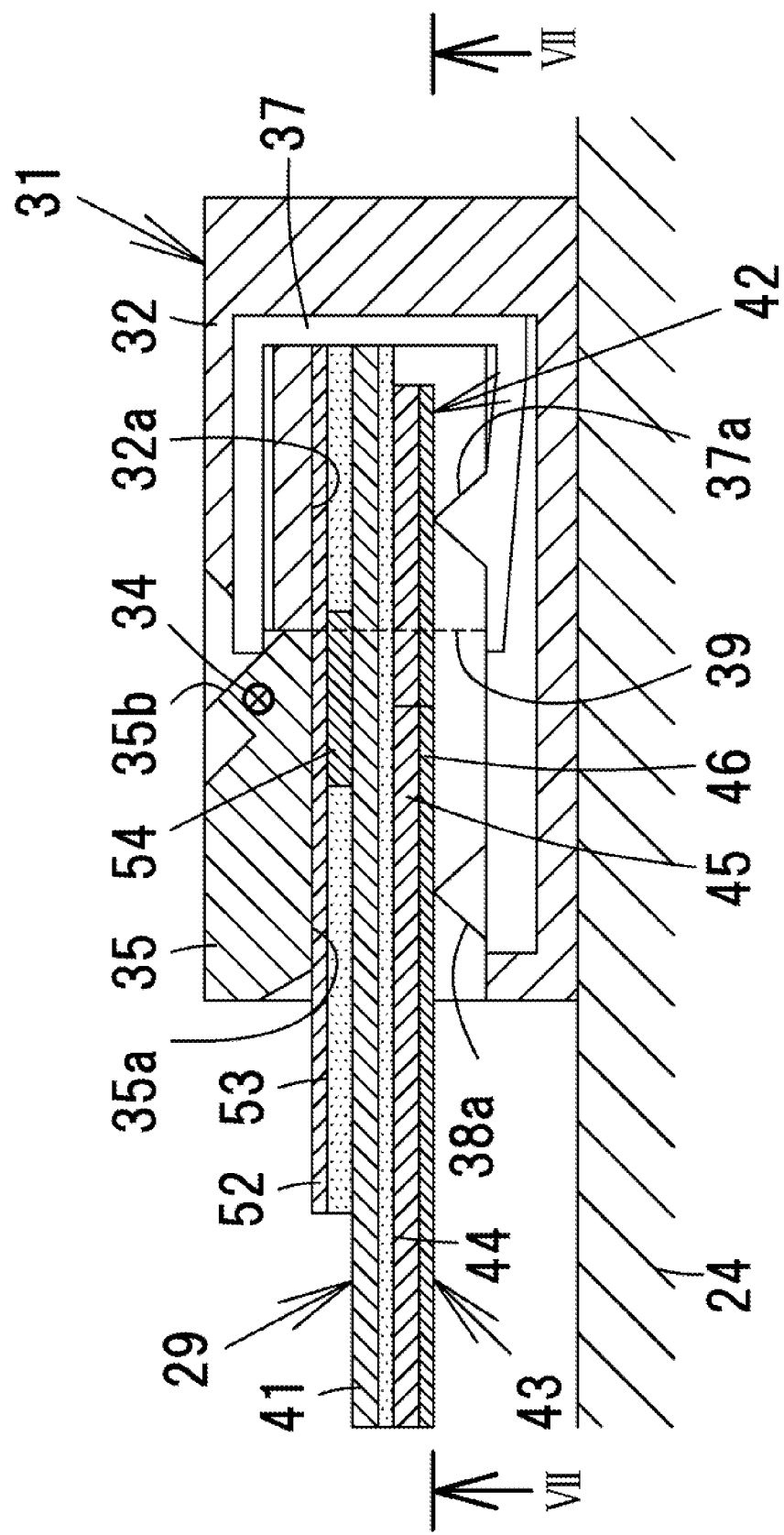
FIG. 5 illustrates a cross-sectional view taken along line V-V in FIG. 4.
Figure 6:
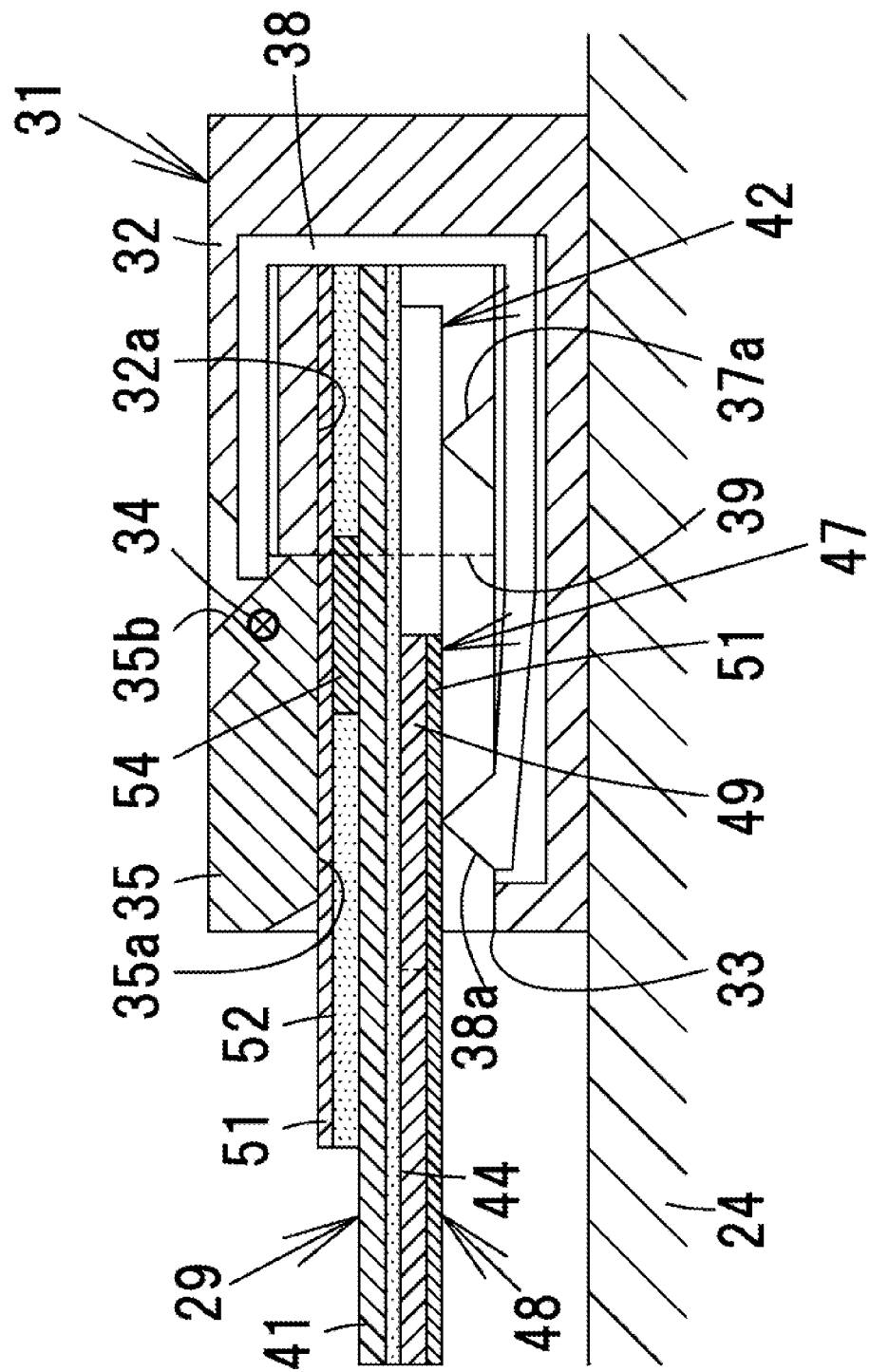
FIG. 6 illustrates a cross-sectional view taken along line VI-VI in FIG. 4.

As illustrated in FIG. 5, a plurality of first conductive terminals 37 are provided in the housing 32. The first conductive terminals 37 have upward-pointing contacts 37a at a first distance from a front end of the housing 32. Also, as illustrated in FIG. 6, a plurality of second conductive terminals 38 are provided in the housing 32. The second conductive terminals 38 have upward-pointing contacts 38a at a second distance, which is shorter than the first distance, from the front end of the housing 32. The first and second conductive terminals 37 and 38 are alternately arranged in the longitudinal direction of the housing 32, and the contacts 37a and 38a thereof receive the surface of the flexible printed board 29. The adjacent first and second conductive terminals 37 and 38 are isolated from each other by the resin material of the housing 32.

A receptacle 39 is defined between the contacts 37a and 38a and at a front end of a top plate of the housing 32. An inward surface 32a of the top plate is a flat surface that receives a back surface of the flexible printed board 29. The front end of the top plate receives a rear end of the lock plate 35. The pivot shaft 34 of the lock plate 35 is provided between the contacts 37a and the contacts 38a. The lock plate 35 is received at a flat pressing surface 35a by the back surface of the flexible printed board 29. At the lock position, the lock plate 35 extends along the same imaginary plane as the inward surface 32a of the housing 32.

Referring to FIGS. 5 and 6, when the lock plate 35 is positioned at the lock position, the first and second conductive terminals 37 and 38 are received at one end by an inclined surface 35b provided at the rear end of the lock plate 35. As a result, the first and second conductive terminals 37 and 38 are lifted up, and thus positioned at the lock position. Consequently, the contacts 37a and 38a are pressed against the front surface of the flexible printed board 29 with a predetermined contact pressure, whereby the flexible printed board 29 is clamped between the lock plate 35 and the first and second conductive terminals 37 and 38. By this contact pressure, the leading end of the flexible printed board 29 is retained by the connector 31 in a manner such as not to be further inserted into or removed from the connector 31.

The flexible printed board 29 includes a base material 41 formed of a resin material such as polyimide resin. As illustrated in FIG. 5, first conductive pads 42 are provided on a front surface of the base material 41. First wiring patterns 43 provided on the front surface of the base material 41 are connected to rear ends of the first conductive pads 42. The first conductive pads 42 are received by the contacts 37a of the first conductive terminals 37. The first conductive pads 42 and the first wiring patterns 43 have a copper foil 45 stuck on the front surface of the base material 41 with an adhesive 44, and a plated film 46 provided on a front surface of the copper foil 45.

As illustrated in FIG. 6, second conductive pads 47 are provided on the front surface of the base material 41. The front end of the second conductive pads 47 are located on the rear sides of the front end of the first conductive pads 42. Further, rear ends of the second conductive pads 47 are connected to second wiring patterns 48 provided on the front surface of the base material 41. The second conductive pads 47 are received by the contacts 38a of the second conductive terminals 38. The second conductive pads 47 and the second wiring patterns 48 have a copper foil 49 stuck on the front surface of the base material 41 with the above-described adhesive 44, and a plated film 51 provided on a front surface of the copper foil 49. Further, the first and second wiring patterns 43 and 48 are each covered with a protective layer (not illustrated) formed of a resin material such as polyimide resin.

A reinforcing plate 52 is provided on a back surface of the base material 41. A front end of the reinforcing plate 52 is defined at the leading end of the flexible printed board 29. A rear end of the reinforcing plate 52 is defined behind the rear ends of the second conductive pads 47. The reinforcing plate 52 is formed of a resin material such as polyimide resin, and is stuck on the back surface of the base material 41 with an adhesive 53. A reinforcing layer 54 is provided between the reinforcing plate 52 and the base material 41, and is formed of metal, for example, a copper dummy pattern in the embodiment. Alternatively, the reinforcing layer 54 may be formed by, for example, a power supply pattern or a ground pattern.

Figure 7:
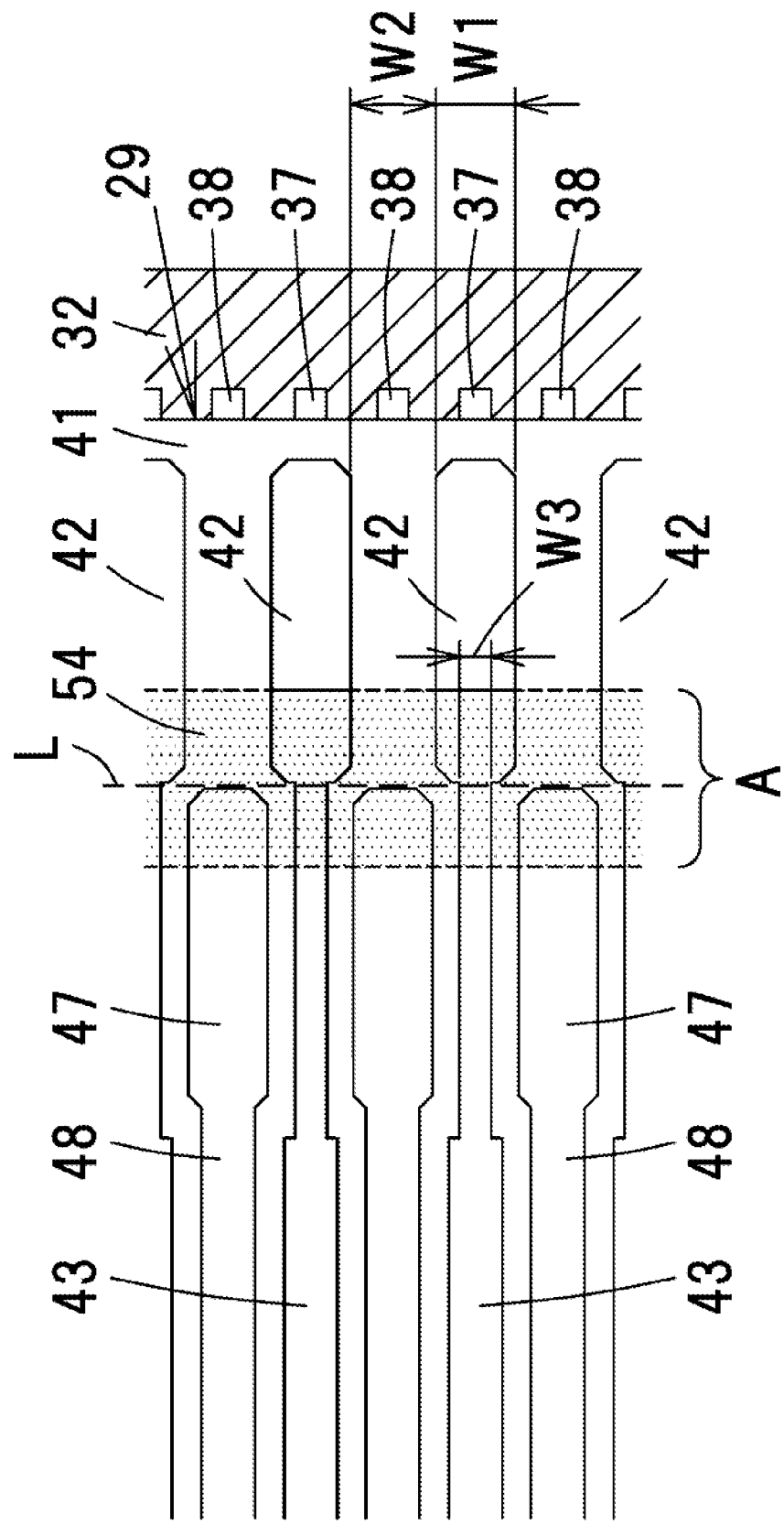
FIG. 7 illustrates a sectional view, taken along line VII-VII in FIG. 5, schematically illustrating a structure of a flexible printed board according to a first embodiment of the present invention.

FIG. 7 schematically illustrates the structure of the flexible printed board 29 in the first embodiment. The first conductive pads 42 are arranged on the front surface of the base material 41 along an imaginary line L defined in the width direction of the flexible printed board 29. The rear ends of the first conductive pads 42 are located on the front side of the imaginary line L. The second conductive pads 47 are arranged on the front surface of the base material 41 along the imaginary line L. The front end of the second conductive pads 47 are located on the rear side of the imaginary line L. In this way, the first conductive pads 42 and the second conductive pads 47 are alternately arranged with the imaginary line L being disposed there between. The first conductive pads 42 form a front conductive pad unit, and the second conductive pads 47 form a rear conductive pad unit.

The first conductive pads 42 each have a first width W1 from the rear end to the front end, and the second conductive pads 47 each have a second width W2 from the front end to the rear end. In FIG. 7, the second width W2 of the second conductive pads 47 is equal to the first width W1. The first wiring pattern 43 are located between the adjacent second conductive pads 47. The first wiring patterns 43 have a third width W3 smaller than the first width W1 and the second width W2. In FIG. 7, the distances between the first conductive pads 42 and the distances between the second conductive pads 47 are equal to the width W1.

The reinforcing layer 54 lines a reinforcing area A extending over the first conductive pads 42 and the second conductive pads 47. A front edge of the reinforcing area A is defined on the front side of the rear ends of the first conductive pads 42. Also, a rear edge of the reinforcing area A is defined on the rear side of the front end of the second conductive pads 47. The reinforcing area A extends with a constant width along the imaginary line L in the width direction of the flexible printed board 29. In FIG. 7, the front edge of the reinforcing area A is defined on the rear side of the front end of the first conductive pads 42. Also, the rear edge of the reinforcing area A is defined on the front side of the rear ends of the second conductive pads 47.

Figure 8:
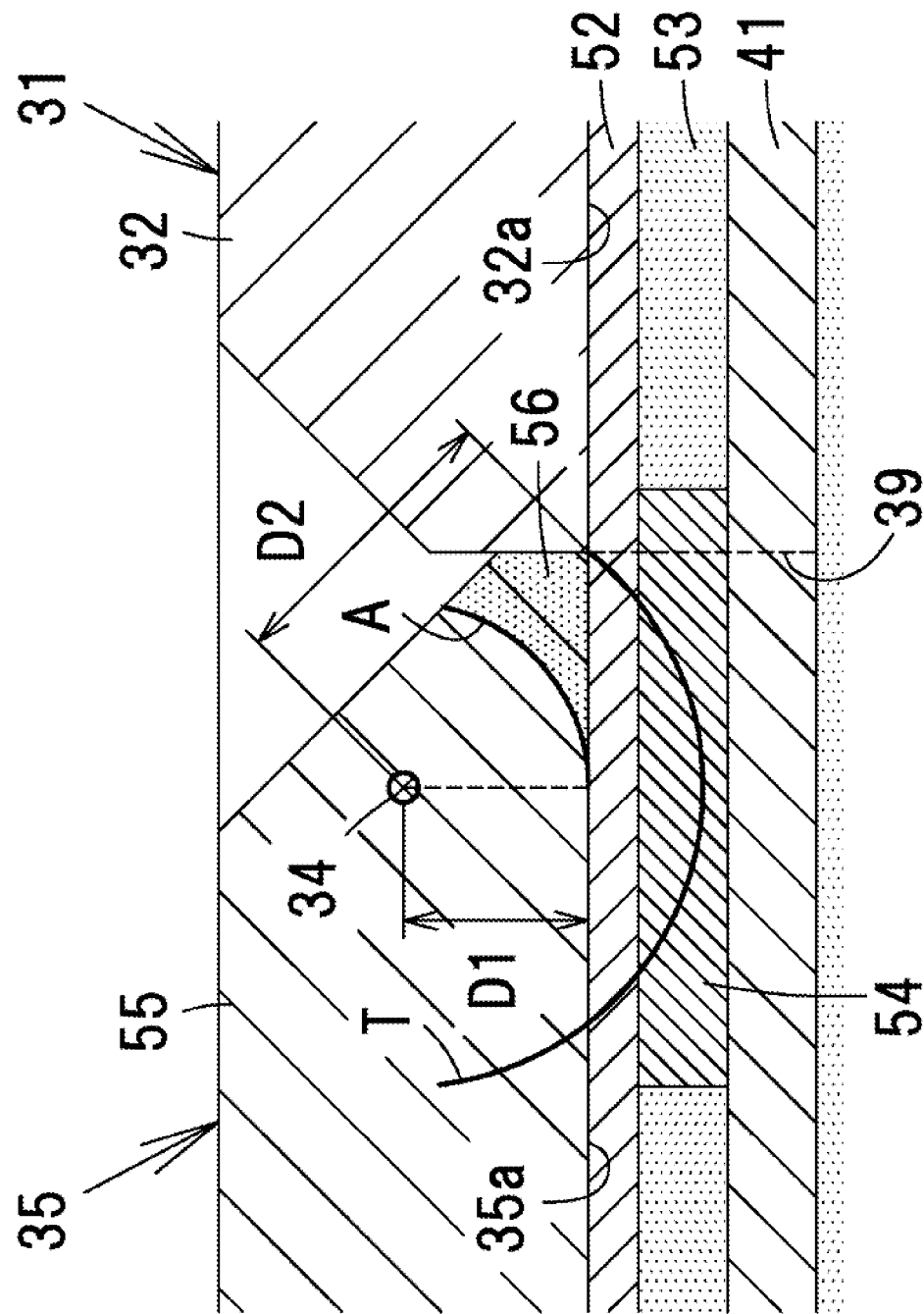
FIG. 8 illustrates an enlarged partial cross-sectional view schematically illustrating a structure of a lock plate.

As illustrated in FIG. 8, an imaginary arc A is drawn around the pivot shaft 34 within a distance D1 from the pivot shaft 34 to the pressing surface 35a. The lock plate 35 includes a main body 55 provided inside the imaginary arc A, and a rear end piece 56 provided outside the imaginary arc A. A distance D2 from the pivot shaft 34 to the rear end piece 56 is set to be longer than the distance D1. Therefore, a movement trajectory T drawn by a rear end of the rear end piece 56 when the lock plate 35 pivots on the pivot shaft 34 enters the flexible printed board 29, and the pivotal movement of the lock plate 35 on the pivot shaft 34 is restricted. The above-described reinforcing layer 54 is provided just below the pivot shaft 34. The reinforcing area A overlaps with the movement trajectory T at the rear end of the lock plate 35.

Figure 9:
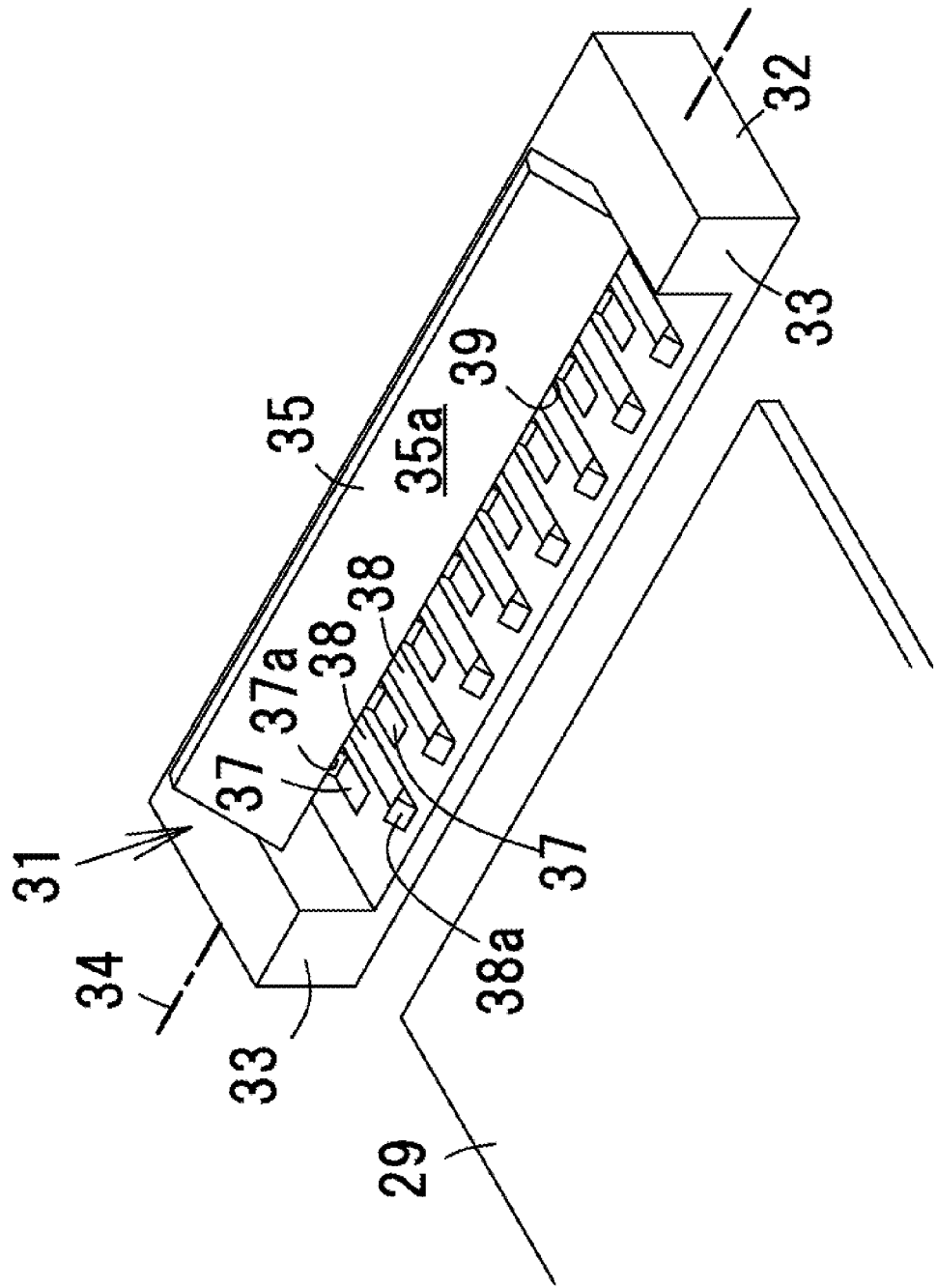
FIG. 9 illustrates a perspective view schematically illustrating a state in which the flexible printed board is to be inserted in a connector.
Figure 10:
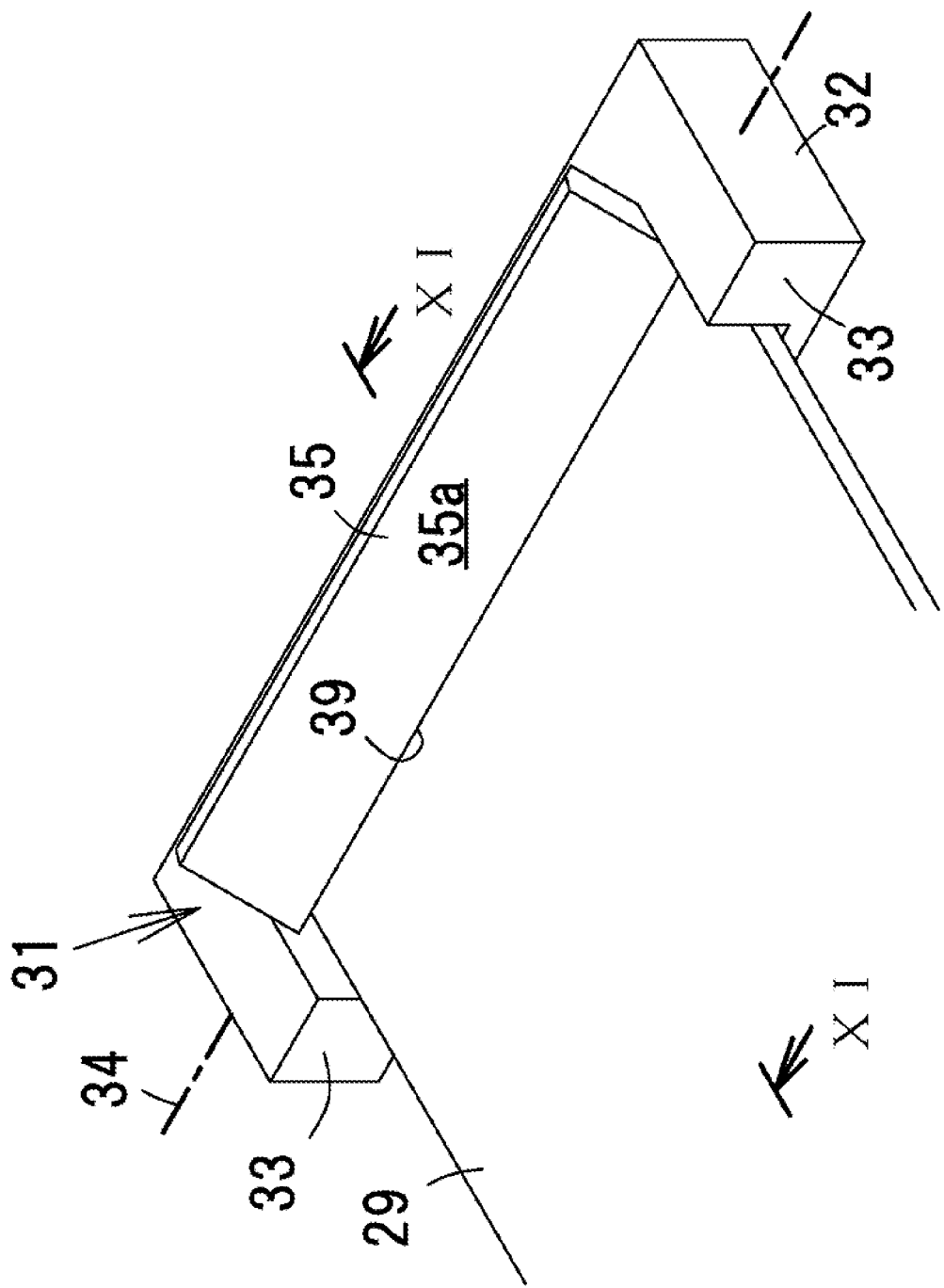
FIG. 10 illustrates a perspective view schematically illustrating a state in which the flexible printed board is inserted in the connector.
Figure 11:
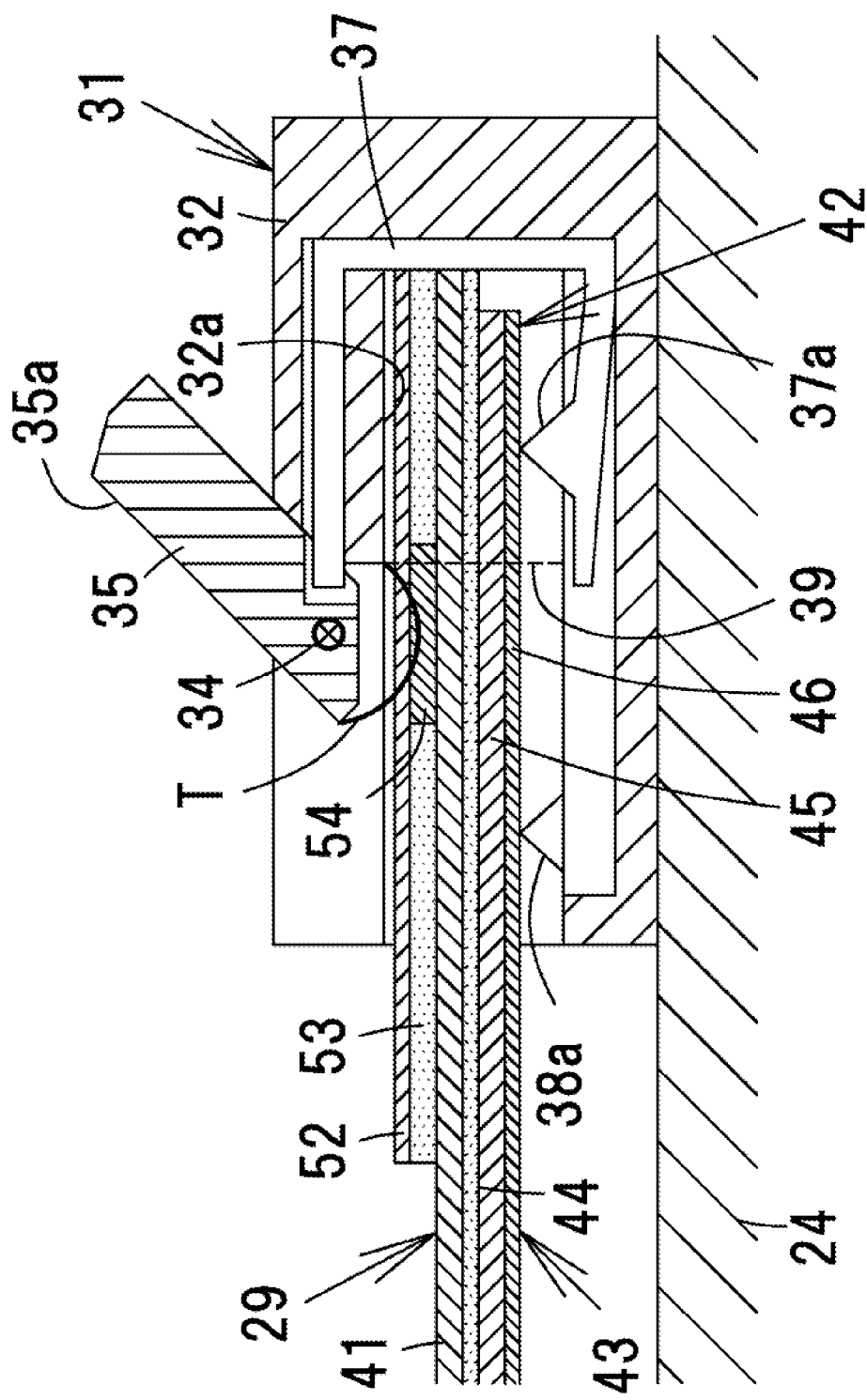
FIG. 11 illustrates a cross-sectional view taken along line Xi-XI in FIG. 10 schematically illustrating a state in which the flexible printed board is inserted in the connector.

FIG. 9 illustrates a situation in which the flexible printed board 29 is to be connected to the connector 31. As illustrated in FIG. 9, when the lock plate 35 is positioned at a non-lock position, the receptacle 39 is opened. The leading end of the flexible printed board 29 is inserted in the receptacle 39, as illustrated in FIG. 10. Then, when the lock plate 35 is positioned at the non-lock position, as illustrated in FIG. 11, interlock between the lock plate 35 and the first and second conductive terminals 37 and 38 is released. As a result, the first and second conductive terminals 37 and 38 are received by a bottom plate of the housing 32. The first conductive pads 42 are placed on the contacts 37a, and simultaneously, the second conductive pads 47 are placed on the contacts 38a. The flexible printed board 29 is retained by the connector 31 in a manner such that it can be inserted into and removed from the connector 31.

Figure 12:
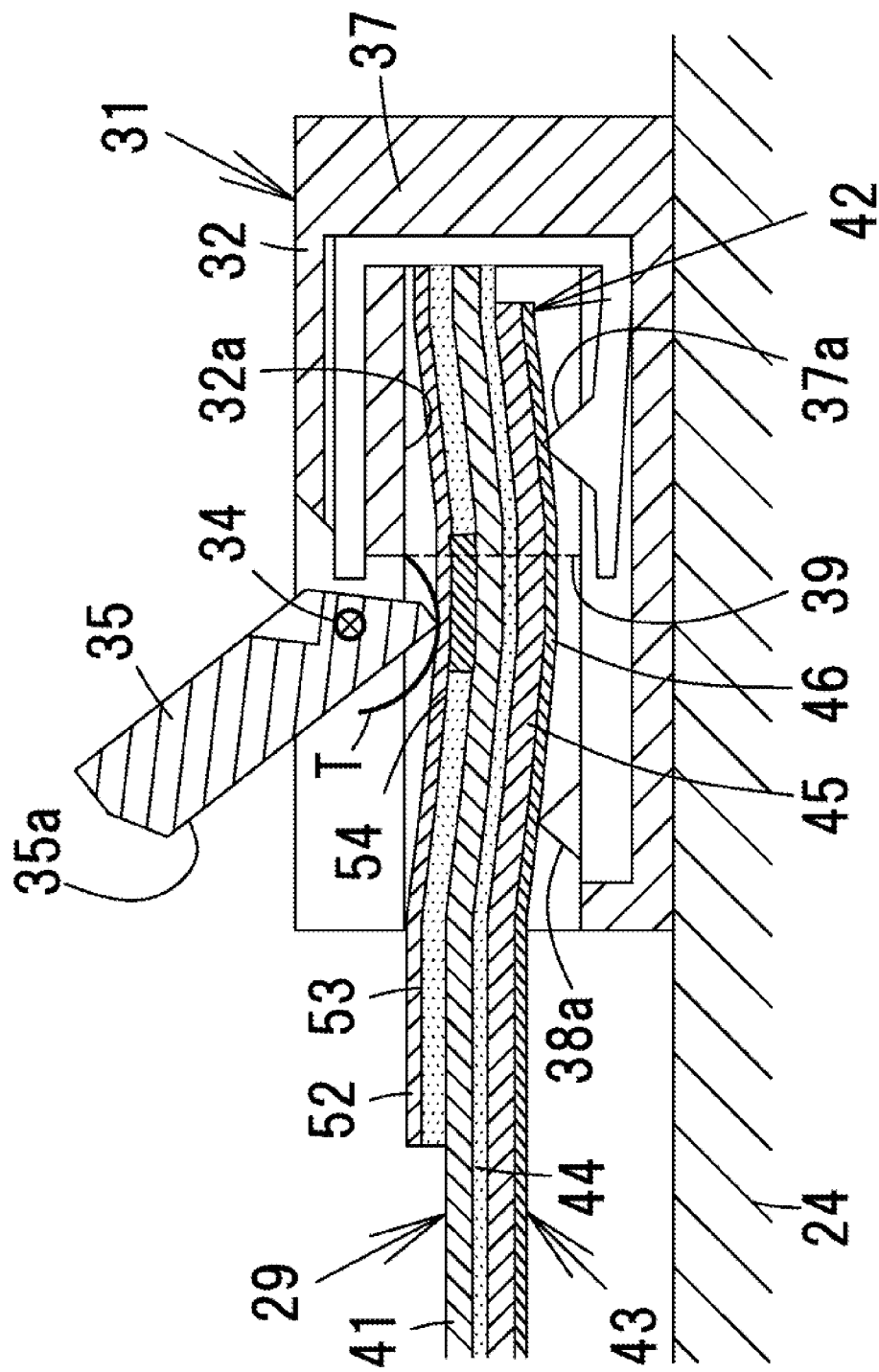
FIG. 12 illustrates a cross-sectional view schematically illustrating a state in which the lock plate pivots toward a lock position.

The lock plate 35 pivots on the pivot shaft 34 toward the lock position. Since the movement trajectory T of the rear end of the rear end piece 56 of the lock plate 35 enters the flexible printed board 29, the rear end of the rear end piece 56 is pressed against the back surface of the flexible printed board 29 between the contacts 37a and 38a. The flexible printed board 29 is thereby curved and bent between the contacts 37a and the contacts 38a, and moves toward the bottom plate of the housing 32. As illustrated in FIG. 12, when the rear end of the rear end piece 56 is positioned just below the pivot shaft 34, the rear end piece 56 is maximally pressed against the flexible printed board 29, so that the flexible printed board 29 is bent maximally.

Figure 13:
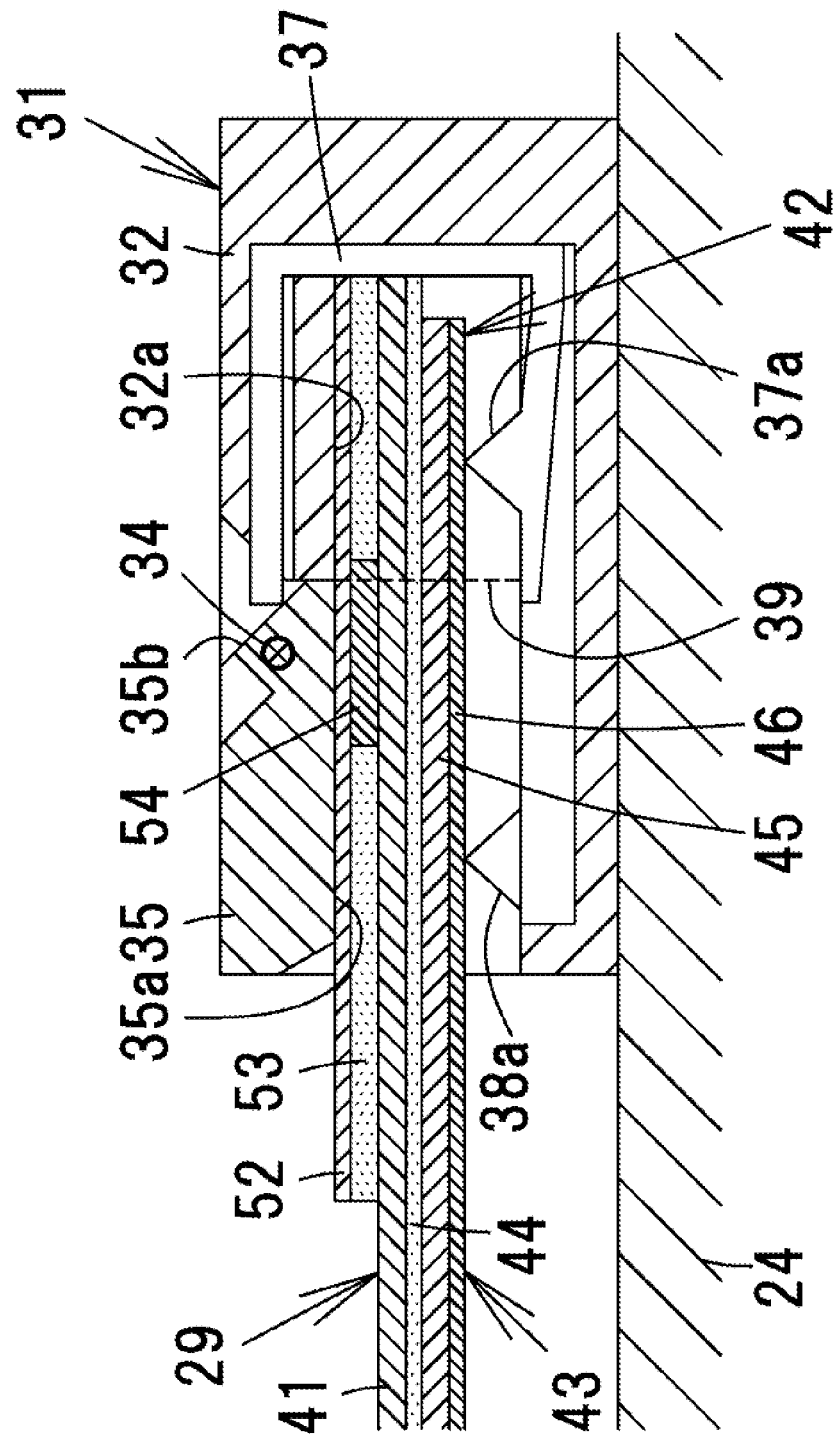
FIG. 13 illustrates a cross-sectional view schematically illustrating a state in which the lock plate is positioned at the lock position.

When the lock plate 35 is positioned at the lock position, as illustrated in FIG. 13, the pressing surface 35a is received by the surface of the flexible printed board 29. Simultaneously, the first and second conductive terminals 37 and 38 are received at one end by the inclined surface 35b of the lock plate 35, and are lifted up and positioned at the lock position. As a result, the flexible printed board 29 is clamped between the lock plate 35 and the contacts 37a and 38a. The flexible printed board 29 is returned to its original shape. Since the rear end piece 56 of the lock plate 35 is received by the surface of the flexible printed board 29, pivotal motion of the lock plate 35 is restricted. Thus, the flexible printed board 29 is retained by the connector 31 in a manner such as not to be inserted into and removed from the connector 31.

In the above-described mobile telephone terminal 11, for example, when the number of terminals increases, the distances between the first conductive pads 42 and the distances between the second conductive pads 47 decrease. As a result, the third width W3 of the first wiring patterns 43 decreases. In the flexible printed board 29, the reinforcing layer 54 lines the reinforcing area A including the boundaries between the first conductive pads 42 and the first wiring patterns 43 where cracking easily occurs. Thus, the reinforcing layer 54 partly reinforces the flexible printed board 29. In the reinforcing area A, bending of the flexible printed board 29 is minimized, and generation of stress is suppressed. Hence, cracking is reduced at the boundaries between the first conductive pads 42 and the first wiring patterns 43. The strength of the flexible printed board 29 is averaged over the entire surface thereof. Moreover, since the first and second conductive pads 42 and 47 respectively have the relatively large first and second widths W1 and W2 outside the reinforcing area A, even when stress is generated in the first and second conductive pads 42 and 47 outside the reinforcing area A, the occurrence of cracking is suppressed in the first and second conductive pads 42 and 47.

Figure 14:
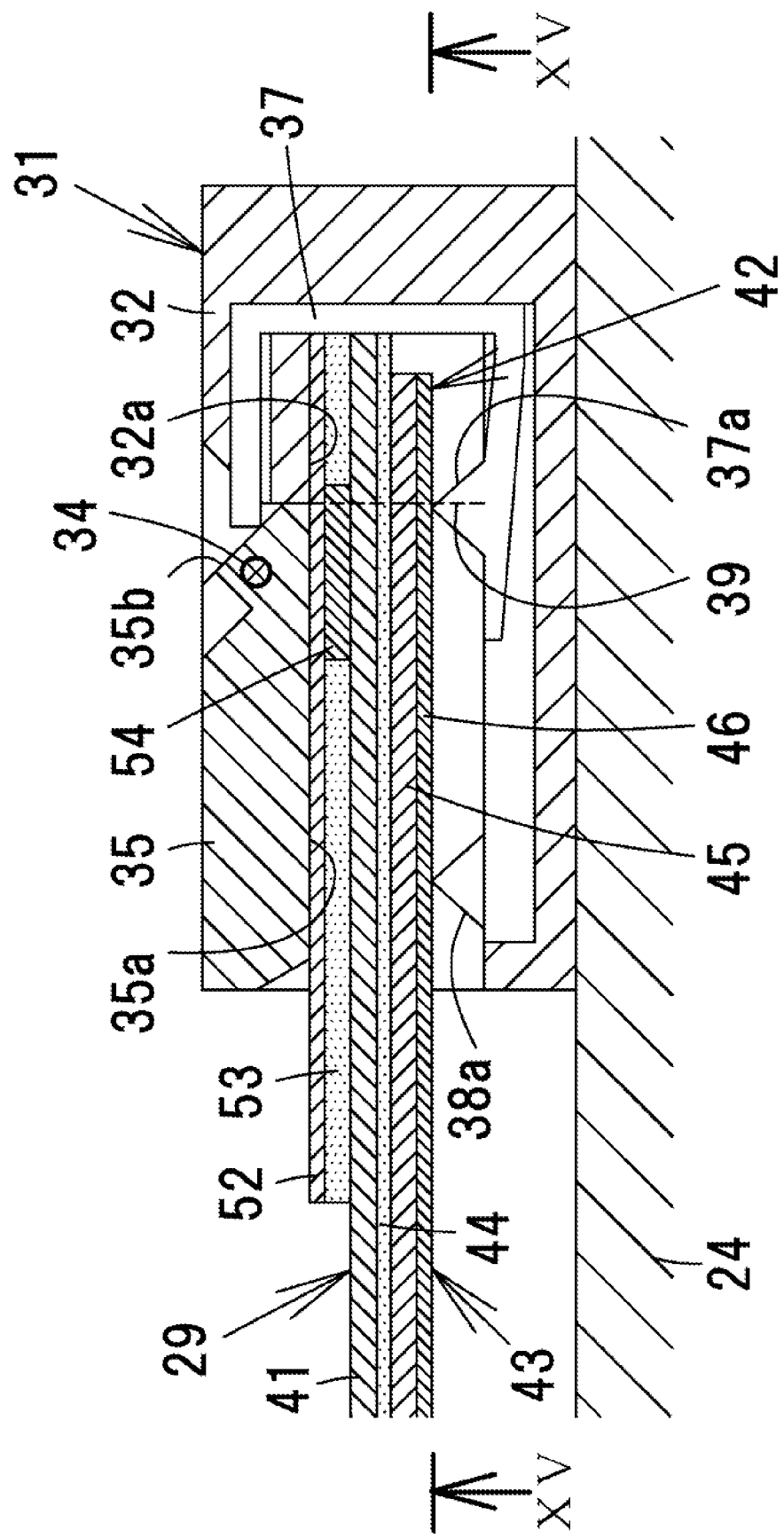
FIG. 14 illustrates a cross-sectional view schematically illustrating another structure example of a flexible printed board.
Figure 15:
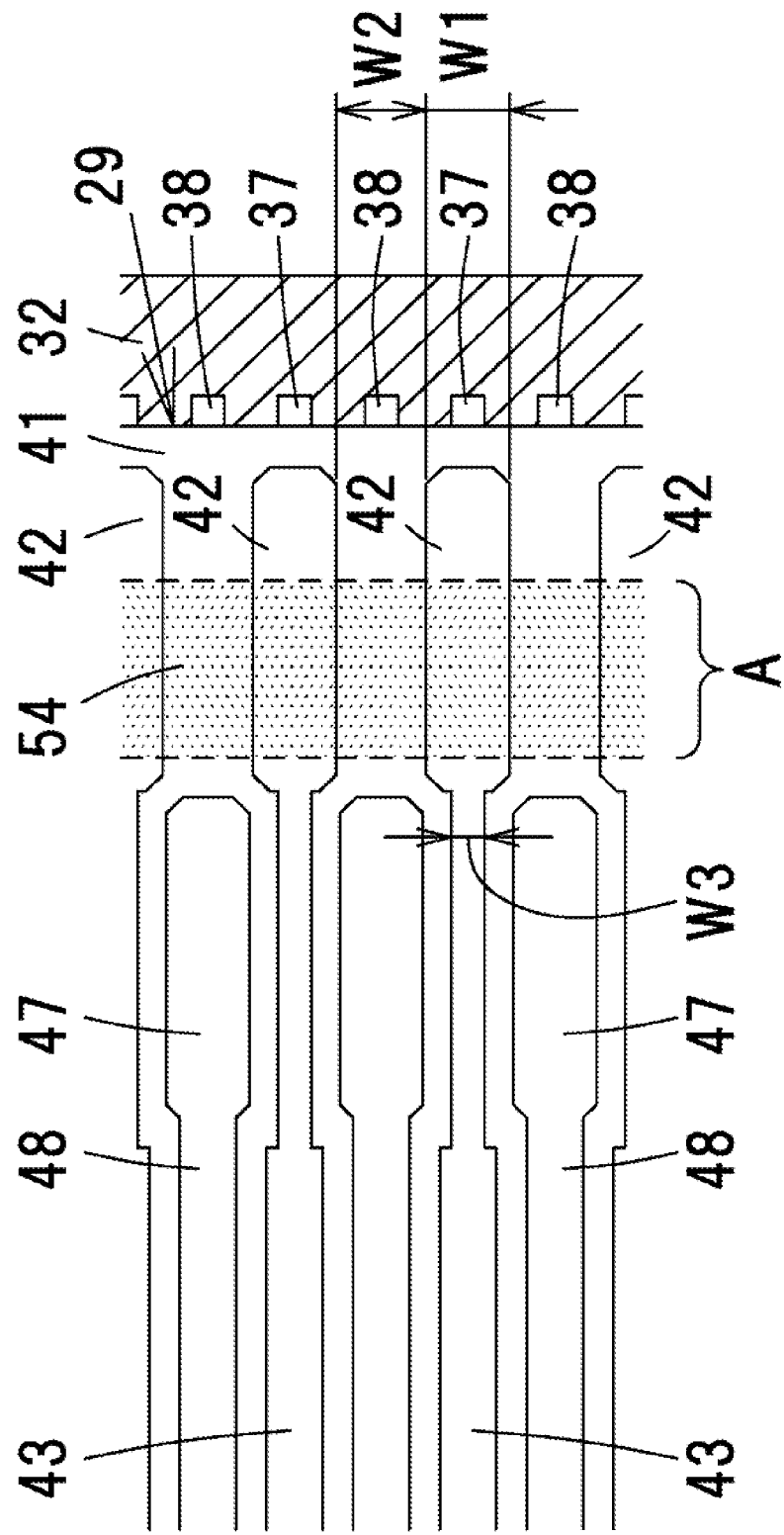
FIG. 15 illustrates a sectional view taken along line XV-XV in FIG. 14.

In the above-described mobile telephone terminal 11, as illustrated in FIG. 14, the pivot shaft 34 of the lock plate 35 provided between the contacts 37a and 38a may be offset toward the contacts 37a. In this case, the reinforcing layer 54 in the flexible printed board 29 is similarly offset toward the leading end of the flexible printed board 29, and is located just below the pivot shaft 34. Referring also to FIG. 15, the front and rear edges of the reinforcing area A are defined on the front side of the rear ends of the first conductive pads 42. Other structures equivalent to the above ones are denoted by the same reference numerals. By virtue of the above-described structure, it is possible to reduce generation of stress in the reinforcing area A and cracking in the first conductive pads 42.

Figure 16:
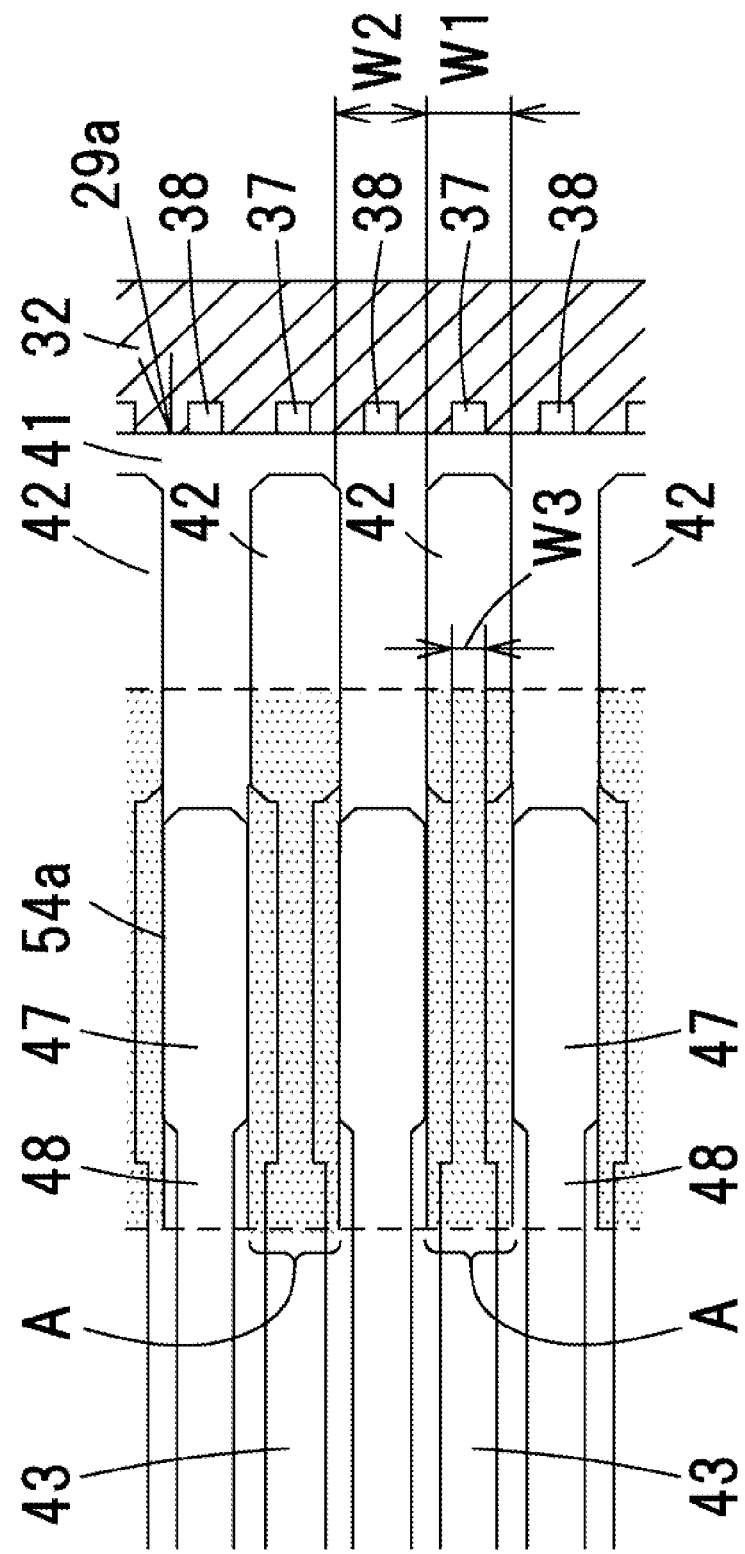
FIG. 16 illustrates a plan view schematically illustrating a structure of a flexible printed board according to a second embodiment of the present invention.
Figure 17:
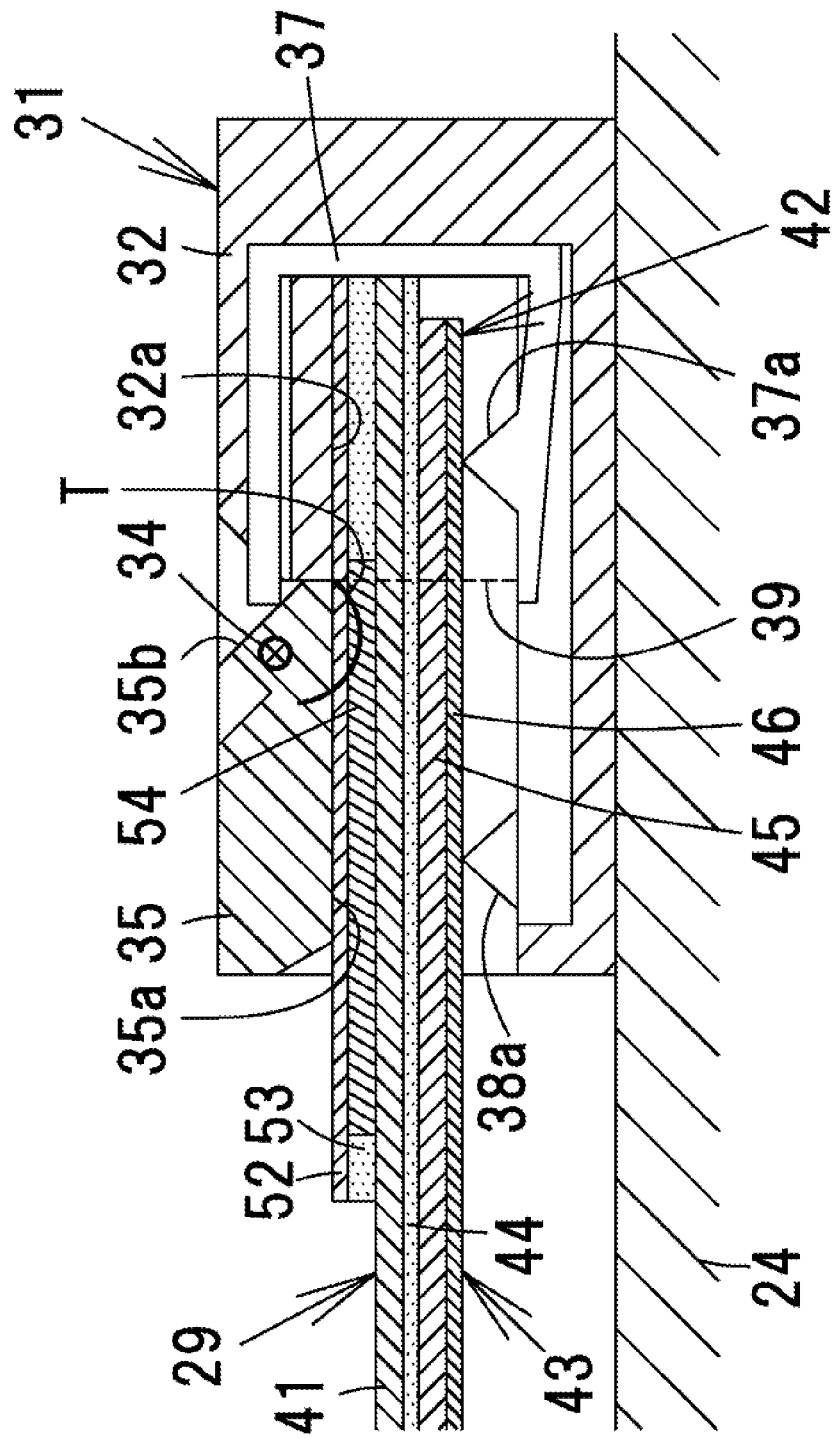
FIG. 17 illustrates a cross-sectional view schematically illustrating the structure of the flexible printed board of the second embodiment.

FIG. 16 schematically illustrates a structure of a flexible printed board 29a according to a second embodiment of the present invention. In this flexible printed board 29a, reinforcing areas A extend on respective first conductive pads 42 and first wiring patterns 43. Front end of the reinforcing areas A are defined on the front side of rear ends of the first conductive pads 42, and rear ends of the reinforcing areas A are defined on the rear side of rear ends of the second conductive pads 47. Referring also to FIG. 17, each of the reinforcing areas A is lined with a reinforcing layer 54a provided on a back surface of a base material 41. The reinforcing layer 54a is located in a region including a movement trajectory T. Other structures equivalent to the above ones are denoted by the same reference numerals. According to the flexible printed board 29a, operational advantages similar to the above can be achieved.

In this flexible printed board 29a, for example, the reinforcing areas A may extend from the first conductive pads 42 and the first wiring patterns 43 to second conductive pads 47 and second wiring patterns 48, as illustrated in FIG. 18. Similarly to the above, the reinforcing areas A are lined with reinforcing layers 54. According to this flexible printed board 29a, the occurrence of cracking in the first wiring patterns 43 is suppressed further.

In the mobile telephone terminal 11, the pivot shaft 34 of the lock plate 35 may be offset from the above-described position toward the contacts 37a or toward the contacts 38a. In other words, the movement trajectory T of the rear end of the lock plate 35 may be located in a region that overlaps with the reinforcing area A or may be provided outside the region. Even when the movement trajectory T is located in this region, operational advantages similar to the above are achieved as long as the reinforcing area A is defined as in the above.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiment has been described in detail, it should be understood that various changes, substitutions, and alterations could be made hereto without departing from the spirit and scope of the invention.

What is claimed is:

1. A flexible printed board comprising:
   a base material;
   a plurality of first conductive pads formed over a first surface of the base material and arranged along an imaginary line on a surface of the base material, the first conductive pads are formed over a front side of the imaginary line and having a first width, and extending from front ends of the first conductive pads to rear ends of the first conductive pads on the imaginary line;
   a plurality of second conductive pads formed over the first surface of the base material and arranged along the imaginary line, the second conductive pads are formed on a rear side of the imaginary line and having a second width, and extending from front ends of the second conductive pads the imaginary line to rear ends of the second conductive pads;
   first wiring patterns formed between the second conductive pads and having a third width and are coupled to the rear ends of the corresponding first conductive pads, the third width being smaller than the first width and the second width; and
   a reinforcing layer formed over a second surface of the base material opposite to the first surface and reinforcing a reinforcing area extending over a part of the first conductive pads and a part of the second conductive pads,
   a front edge of the reinforcing area is defined between the front ends and the rear ends of the first conductive pads and
   a rear edge of the reinforcing area is defined between the front ends and the rear ends of the second conductive pads.

2. An electronic apparatus comprising a flat flexible printed board that includes:
   a base material;
   a plurality of first conductive pads formed over a first surface of the base material and arranged along an imaginary line on a surface of the base material, the first conductive pads are formed over a front side of the imaginary line and having a first width, and extending from front ends of the first conductive pads to rear ends of the first conductive pads on the imaginary line;
   a plurality of second conductive pads formed over the first surface of the base material and arranged along the imaginary line, the second conductive pads are formed on a rear side of the imaginary line and having a second width, extending from front ends of the second conductive pads the imaginary line to rear ends of the second conductive pads;
   first wiring patterns formed between the second conductive pads and having a third width and are couple to the rear ends of the corresponding first conductive pads, the third width being smaller than the first width and the second width; and
   a reinforcing layer formed over a second surface of the base material opposite to the first surface and reinforcing a reinforcing area extending over a part of the first conductive pads and a part of the second conductive pads, a front edge of the reinforcing area is defined between the front ends and the rear ends of the first conductive pads and a rear edge of the reinforcing area is defined between the front ends and the rear ends of the second conductive pads.

\* \* \* \* \*